(12) United States Patent
Motomura

(10) Patent No.: US 9,902,880 B2
(45) Date of Patent: Feb. 27, 2018

(54) FILM MATERIAL, ELECTRONIC COMPONENT USING FILM MATERIAL, AND METHOD FOR PRODUCING ELECTRONIC COMPONENT

(71) Applicant: Panasonic Intellectual Property Management Co., Ltd., Osaka (JP)

(72) Inventor: Koji Motomura, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 34 days.

(21) Appl. No.: 14/997,130

(22) Filed: Jan. 15, 2016

(65) Prior Publication Data
US 2016/0280965 A1 Sep. 29, 2016

(30) Foreign Application Priority Data

Mar. 25, 2015 (JP) ................................. 2015-063422
Mar. 25, 2015 (JP) ................................. 2015-063429

(51) Int. Cl.
*H01L 23/00* (2006.01)
*C09J 9/02* (2006.01)
(Continued)

(52) U.S. Cl.
CPC ................ *C09J 9/02* (2013.01); *H01L 24/29* (2013.01); *H01L 24/32* (2013.01); *H01L 24/83* (2013.01); *H05K 3/323* (2013.01); *C09J 163/00* (2013.01); *C09J 2201/602* (2013.01); *C09J 2201/606* (2013.01); *C09J 2203/326* (2013.01); *C09J 2205/102* (2013.01); *C09J 2463/00* (2013.01); *C09J 2481/00* (2013.01); *H01L 2224/16227* (2013.01); *H01L 2224/27003* (2013.01); *H01L 2224/27436* (2013.01); *H01L 2224/293* (2013.01); *H01L 2224/2929* (2013.01); *H01L 2224/2939* (2013.01); *H01L 2224/29339* (2013.01); *H01L 2224/29355* (2013.01); *H01L 2224/29364* (2013.01); *H01L 2224/29499* (2013.01); *H01L 2224/32225* (2013.01); *H01L 2224/73204* (2013.01); *H01L 2224/81193* (2013.01); *H01L 2224/81201* (2013.01); *H01L 2224/83192* (2013.01); *H01L 2224/83201* (2013.01); *H05K 1/141* (2013.01);
(Continued)

(58) Field of Classification Search
CPC .................. D01D 5/0007; H01L 24/00; H01L 24/29–24/32; H01L 24/83
USPC ....................... 428/221, 339; 442/59, 62, 164
See application file for complete search history.

(56) References Cited

U.S. PATENT DOCUMENTS

2009/0291314 A1 11/2009 Sakai et al.
2010/0259910 A1* 10/2010 Hayashi .................... B32B 5/28
361/783

(Continued)

FOREIGN PATENT DOCUMENTS

JP 2008-69316 A 3/2008
JP 2003-261833 A 9/2009

*Primary Examiner* — Matthew D Matzek
(74) *Attorney, Agent, or Firm* — Pearne & Gordon LLP

(57) ABSTRACT

A film material includes a substrate and a film layer arranged on one main surface of the substrate. The film layer contains a fibrous first resin and a thermosetting second resin in an uncured or semi-cured state, and a linear expansion coefficient CF of the first resin is smaller than a linear expansion coefficient CR of the second resin in cured state.

13 Claims, 5 Drawing Sheets

(51) Int. Cl.
*H05K 3/32* (2006.01)
*C09J 163/00* (2006.01)
*H05K 1/14* (2006.01)

(52) U.S. Cl.
CPC .......... *H05K 2201/0278* (2013.01); *H05K 2201/0293* (2013.01); *H05K 2201/068* (2013.01); *H05K 2201/10674* (2013.01); *H05K 2201/10727* (2013.01)

(56) References Cited

U.S. PATENT DOCUMENTS

2011/0217547 A1* 9/2011 Mather ................. B29C 61/003
  428/339
2015/0257263 A1* 9/2015 Sethumadhavan .. H05K 1/0366
  257/88

* cited by examiner

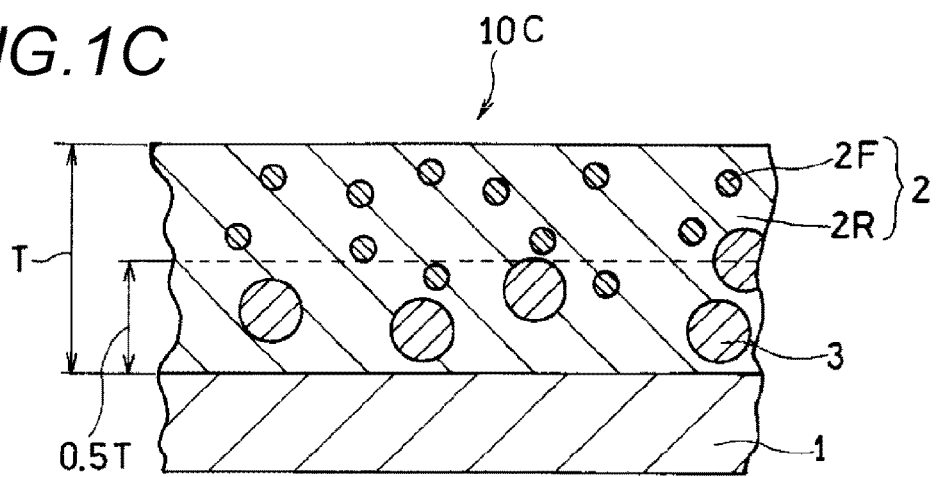
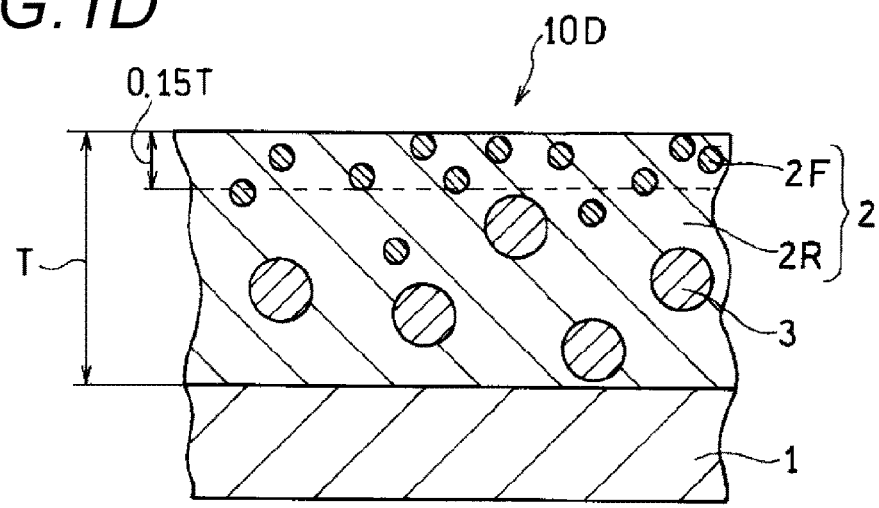
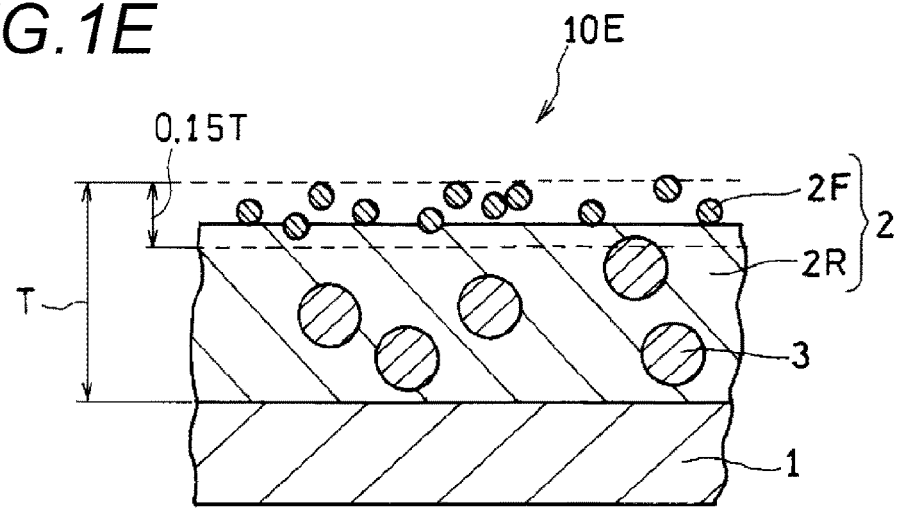

FILM MATERIAL, ELECTRONIC COMPONENT USING FILM MATERIAL, AND METHOD FOR PRODUCING ELECTRONIC COMPONENT

CROSS-REFERENCES TO RELATED APPLICATION(S)

This application is based on and claims priorities from Japanese Patent Applications No. 2015-63422 and No. 2015-63429, both filed on Mar. 25, 2015, the entire contents of which are incorporated herein by reference.

BACKGROUND

1. Field of the Invention

The present invention relates to a film material, an electronic component using the film material, and a method for producing an electronic component, and especially relates to a film material having a small linear expansion coefficient.

2. Description of Related Art

As a method for mounting a circuit member having a large number of interconnection sites therein on another circuit member, a wire bonding method and a flip-chip bonding method are widely employed. Above all, fine-pitch bonding and flip-chip bonding attracts attention as enabling weight reduction and thinning of electronic appliances.

The flip-chip bonding method includes a method of bonding circuit members by bump soldering and sealing up the two with an underfill material, a method of bonding the two via an electroconductive adhesive (JP-A-2008-69316 as Patent Literature 1, etc.), a method of bonding and interconnecting the two via ACF (anisotropic conductive film), a method of bonding the two via NCF (non-conductive film) and interconnecting the two by a soldering bump, etc. In particular, the method using a film material such as ACF, NCF or the like is useful since the production method is simple.

In a case where circuit members such as individualized semiconductor chips or the like are picked up and bonded to another circuit member to be a support, a filmy adhesive that is referred to as a die-bonding film may be used (JP-A-2003-261833 as Patent Literature 2).

Patent Literature 1: JP-A-2008-69316
Patent Literature 2: JP-A-2003-261833

SUMMARY

As the resin to constitute ACF, NCF, die-bonding film and the like, in general, a thermosetting resin such as an epoxy resin or the like is used. Therefore, for bonding circuit members to each other, thermal compression bonding is employed. For example, silicon semiconductor chips are bonded through thermal compression to a glass epoxy substrate via a thermosetting resin-containing film layer to produce a package structure. However, in a cooling step after thermal compression bonding, the package structure may deform or there may occur separating between the circuit members and the film layer. This is because the thermal expansion coefficient differs between the materials. When materials differing in the linear thermal expansion coefficient are used in combination, and heated and cooled, thermal stress forms owing to the difference in the thermal expansion coefficient. Thermal stress readily focuses in the interface between the materials, especially at the edges of the interface.

In general, a thermosetting resin has an extremely large linear expansion coefficient as compared with a silicon or glass epoxy substrate. The linear expansion coefficient of a thermosetting resin could be, for example, several tens of times that of silicon. In addition, the linear expansion coefficient of a thermosetting resin could be, for example, a few times that of a glass epoxy substrate.

Given the situation, it may be taken into consideration to use a resin called an engineering plastic or a super engineering plastic (hereinafter referred to as an engineering plastic as combined) having a small linear expansion coefficient. Using an engineering plastic, the expansion coefficient of the entire film layer is expected to be small.

For example, for shaping an epoxy resin into a film, a method (solution casting method) where an epoxy resin is dissolved in an organic solvent, the solution is cast onto a substrate and the organic solvent is removed is generally employed. However, in general, a resin having excellent heat resistance such as an engineering plastic and the like hardly dissolves in an ordinary organic solvent that is used for dissolving any other resin (for example, epoxy resin, etc.). Consequently, the homogeneousness of the film layer containing an engineering plastic worsens and the bonding performance thereof also worsens.

For increasing the homogeneousness of a film, it may be taken into consideration to use an organic solvent capable of dissolving an engineering plastic (for example, N,N-dimethylacetamide, N-methyl-2-pyrrolidone, etc.). However, these solvents have a high boiling point. Consequently, when such an organic solvent is used as a material for film, high-temperature drying treatment must be carried out for removing the organic solvent. By the drying treatment, an epoxy resin would be inconveniently cured.

As the case may be, a latent curing agent in which the curing component is covered with a polymer may be used as a curing agent for an epoxy resin. However, the polymer to cover the curing component may be dissolved by the organic solvent that dissolves an engineering plastic as described above, thereby providing an inconvenience that an epoxy resin may cure before forming a film.

One aspect of the present invention relates to a film material including a substrate; and a film layer arranged on one main surface of the substrate, wherein: the film layer contains a fibrous first resin and a thermosetting second resin in an uncured or semi-cured state, and a linear expansion coefficient CF of the first resin is smaller than a linear expansion coefficient CR of the second resin in a cured state.

One aspect of the present invention relates to a film material including: a substrate; and a film layer arranged on one main surface of the substrate, wherein: the film layer contains a fibrous first resin and a thermosetting second resin in an uncured or semi-cured state, a softening start temperature ST1 of the first resin is higher than a softening start temperature ST2 of the second resin in the uncured or semi-cured state, and where a thickness of the film layer is referred to as T, a volume fraction $VF1_{0.5}$ of the fiber in a region from a surface of the film layer on a substrate side to 0.5 T is larger than a volume fraction $VF2_{0.5}$ of the fiber in a region from another surface of the film layer to 0.5 T.

Another aspect of the present invention relates to an electronic component including: a first circuit member; and a second circuit member, wherein: the second circuit member is mounted on the first circuit member via a bonding material, the bonding material contains a fibrous first resin and a thermosetting second resin in a cured state, wherein a linear expansion coefficient CF of the first resin is smaller than a linear expansion coefficient CR of the second resin in the cured state.

Still another aspect of the present invention relates to a method for producing an electronic component, the method including: preparing a film material including a substrate and a film layer arranged on one main surface of the substrate; laminating the film material on a first circuit member so that the first circuit member and the film layer face each other; separating the substrate from the film layer; laminating a second circuit member on the first circuit member so that the film layer and the second circuit member face each other; and thermally compressing the first circuit member and the second circuit member, wherein: the film layer contains a fibrous first resin and a thermosetting second resin in an uncured or semi-cured state, and a linear expansion coefficient CF of the first resin is smaller than a linear expansion coefficient CR of the second resin in a cured state.

According to one or more aspects of the present invention, there may be provided a film material having a small thermal expansion coefficient and suitable as a boding material for circuit members. Further, there may also be provided an electronic component excellent in bonding reliability.

BRIEF DESCRIPTION OF THE DRAWINGS

FIG. 1C is a cross-sectional view schematically showing a film material according to an embodiment 1 of the present invention.

FIG. 1D is a cross-sectional view schematically showing a film material according to an embodiment 1 of the present invention.

FIG. 1E is a cross-sectional view schematically showing a film material according to an embodiment 1 of the present invention.

DETAILED DESCRIPTION

Embodiment 1

Figure 1A:
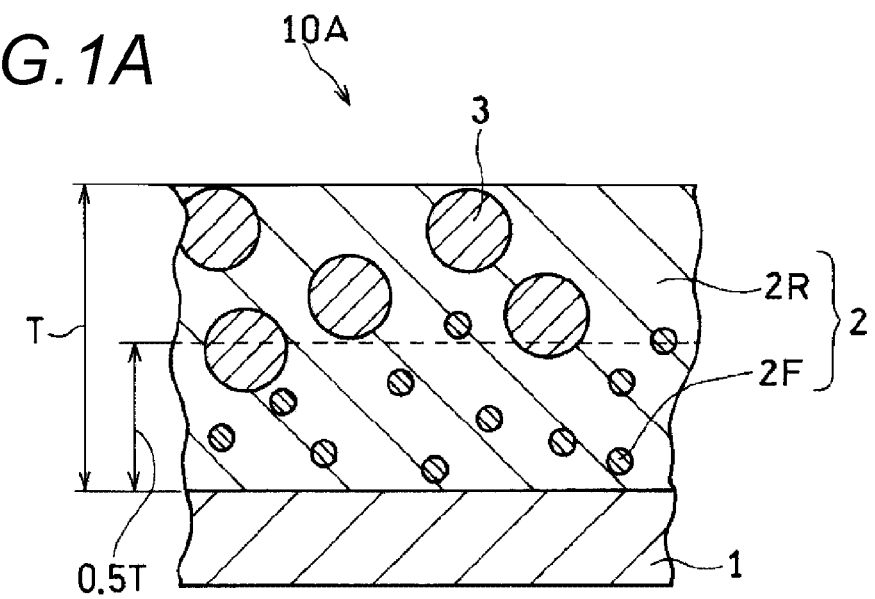
FIG. 1A is a cross-sectional view schematically showing a film material according to embodiments 1 and 2 of the present invention.

The film material according to an embodiment 1 of the present invention includes a substrate and a film layer arranged on one main surface of the substrate, wherein the film layer contains a fibrous first resin and an uncured or semi-cured, thermosetting second resin, and the linear expansion coefficient CF of the first resin is smaller than the linear expansion coefficient CR of the cured second resin. In this, the thermal expansion coefficient of the film layer is small. Consequently, an electronic component produced using the film material is excellent in interconnection reliability. The film material includes, for example, ACF, NCF, die-bonding film, etc.

The volume fraction of fibers VF in the film layer is preferably from 0.01 to 0.5. With that, the thermal expansion coefficient of the film layer is small and the interconnection reliability of the electronic component improves further.

Where the thickness of the film layer is referred to as TF, the volume fraction of fibers in the region from the surface of the film layer on the substrate side to 0.5 TF may be different from the volume fraction of fibers in the region from the other surface of the film layer to 0.5 TF. In particular, the volume fraction $VF_{0.15}$ of fibers in the region from the surface of the film layer on the substrate side to 0.15 TF is preferably different from the volume fraction $VF_{0.85}$ of fibers in the region from the other surface of the film layer to 0.85 TF. The film material of the type is favorable as a bonding material for bonding circuit members differing in the thermal expansion coefficient.

The diameter of the fibers contained in the film layer is preferably 1 μm or less. This is because, when the film layer is used as a bonding material for bonding circuit members, the second resin flowing would hardly be disturbed during thermal compression bonding. In addition, when the film layer contains an electroconductive material, the electroconductive material could easily move to secure electric conduction.

Preferably, the fibers are contained in the film layer in the form of a nonwoven fabric. This is because a nonwoven fabric can make it easy to control the volume fraction of fibers in the film layer. In addition, not having directionality with respect to flexibility, the film layer of the type can readily follow any transfer medium having an uneven surface, in thermal transferring.

In the case where the film layer further contains an electroconductive material, the film layer may be used as a filmy electroconductive adhesive for interconnection of circuit members having electrodes facing each other.

The electronic component according to an aspect of the present invention includes a first circuit member and a second circuit member, wherein the second circuit member is mounted on the first circuit member via a bonding material. The bonding material contains a fibrous first resin and a cured thermosetting second resin, and the linear expansion coefficient CF of the first resin is smaller than the linear expansion coefficient CR of the cured second resin. With that, the interconnection reliability of the electronic component improves.

In a case where the first circuit member and the second circuit member differ in the linear expansion coefficient and where the thickness of the bonding material is referred to as TJ, it is desirable that the volume fraction $VJ1_{0.5}$ of fibers in the region from the surface of the bonding material on the first circuit member side to 0.5 TJ is different from the volume fraction $VJ2_{0.5}$ of fibers in the region from the surface of the bonding material on the second circuit member side to 0.5 TJ.

For example, in a case where the linear expansion coefficient CC1 of the first circuit member in the contact part thereof to the bonding material and the linear expansion coefficient CC2 of the second circuit member in the contact part thereof to the bonding material satisfy relationship CC1>CC2, it is desirable that the volume fraction $VJ1_{0.5}$ and the volume fraction $VJ2_{0.5}$ satisfy relationship $VJ1_{0.5}<VJ2_{0.5}$. This is because the difference in the thermal expansion coefficient between each circuit member and each surface of the bonding material kept in contact with the circuit member can be small, and the interconnection reliability of the electronic component can thereby further improve.

In a case where the first circuit member and the second circuit member have electrode facing each other, it is desirable that the bonding material contains an electroconductive material. This is because the bonding material enables electric interconnection between the facing electrodes.

The production method for an electronic component according to an aspect of the present invention includes a step of preparing a film material including a substrate and a film layer arranged on one main surface of the substrate, a step of laminating the film material on a first circuit member so that the first circuit member and the film layer face each other, a step of separating the substrate from the film layer, and a step of laminating a second circuit member on the first circuit member so that the film layer and the second circuit member face each other, and thermally compressing the first circuit member and the second circuit member.

In this case, the film layer to be transferred to the first circuit member contains a fibrous first resin and a thermosetting second resin in an uncured or semi-cured state. The linear expansion coefficient CF of the first resin is smaller than the linear expansion coefficient CR of the second resin in a cured state. Accordingly, the thermal expansion coefficient of the entire film layer 2 can be smaller than that of a case containing the second resin alone. As a result, the difference in the thermal expansion coefficient between the circuit members can be small, and the interconnection reliability of the electronic component thereby improves.

The film material may be produced according to a production method including a step of fibrously depositing a first resin on a substrate and a step of applying a second resin onto the fibers-deposited surface of the substrate. In this case, many fibers are arranged on the substrate side. Otherwise, the film material may be produced according to a production method including a step of applying a second resin onto a substrate, and a step of fibrously depositing a first resin on the liquid-coated surface of the substrate. In this case, many fibers are arranged on the side opposite to the substrate.

[Film Material]

Examples of the film material according to the embodiment 1 of the present invention are described below with reference to FIGS. 1A to 1E. These embodiments are to mainly demonstrate cases where the film material is used as a bonding material for circuit members, such as ACF or NCF. FIGS. 1A to 1E are cross-sectional views each schematically showing the film material of different embodiments of the present invention.

In a case where the film material 10 is used as a bonding material for a first circuit member and a second circuit member (for example, as ACF, NCF, a die-bonding film or the like), the film layer 2 is thermally transferred onto one circuit member, and the substrate 1 is separated off. Next, another circuit member is laminated and thermally compressed whereby the circuit members are bonded to each other.

The film material 10 includes a substrate 1 and a film layer 2 arranged on one main surface of the substrate 1. The film layer 2 contains a second resin that is uncured or semi-cured and is solidified at room temperature (for example, 20 to 35° C.) (thermosetting resin 2R) and a fibrous first resin (fiber 2F). The semi-cured state means that the resin has not completely cured but has lost flowability. The solidified state means that the resin has lost flowability, and for example, as described below, in a case where a liquid containing the thermosetting resin 2R is applied onto the substrate 1, a part or all of the solvent contained in the solution has been removed in the solidified state.

The fiber 2F has a linear expansion coefficient CF smaller than the linear expansion coefficient CR of the cured thermosetting resin 2R (hereinafter this may be simply referred to as "linear expansion coefficient "CR"). Therefore, in the process of laminating circuit members, thermally compressing them and cooling the resultant laminate, the thermal expansion coefficient of the entire film layer 2 can be smaller than that of the thermosetting resin 2R alone. Consequently, thermal stress to be caused by the difference in the thermal expansion coefficient between circuit members reduces, and delamination at the interface between the circuit member and the film layer can be prevented. In addition, deformation of electronic components can also reduce.

[Film Layer]

The volume fraction VF of the fiber 2F relative to the entire film layer 2 is preferably from 0.01 to 0.5, more preferably from 0.04 to 0.5. When the volume fraction VF falls within the range, the thermal expansion coefficient of the film layer 2 can be sufficiently reduced and the film material can be excellent in flexibility. With that, the adhesiveness to transfer media can improve. Further, when the volume fraction VF falls within the range, flowing of the thermosetting resin 2R is hardly disturbed during thermal compression. Consequently, the bonding performance between circuit members improves and the interconnection reliability of the electronic components to be obtained also improves.

The linear expansion coefficient is measured, for example, using a thermal mechanical analyzer (TMA). Concretely, the film layer 2 is layered to have a predetermined thickness (for example, 0.5 mm), and is cut out to have a predetermined size, length and width (for example, length 30 mm×width 5 mm) to prepare a sample. Both sides in the lengthwise direction of the resultant sample are chucked with a tensile tool, and while heating at a predetermined temperature, a load is applied to the sample to such a degree that the sample would not deform by the load. In this case, the elongation amount of the sample is measured.

The linear expansion coefficient CR is not specifically defined, but is, for example, preferably from 30 to 80 ppm/° C. The glass transition point Tg of the cured thermosetting resin 2R is, from the viewpoint of interconnection reliability, preferably from 100 to 150° C. The glass transition point Tg is measured according to a DMA method, under the measurement condition at a heating rate of 2° C./min and a frequency of 1 Hz. (The same shall apply hereinafter.)

The film layer 2 contains the first resin 2Fa in the form of fibers. In other words, the first resin 2Fa that has been shaped in fibers is arranged on the substrate 1. Therefore, not using an organic solvent having a high boiling point to dissolve the first resin 2Fa, the film material 10 can be produced. In other words, the step of removing an organic solvent does not require high-temperature treatment and therefore in the process of producing the film material, the thermosetting resin hardly cures. Consequently, in the thermal transfer step, the adhesiveness between the film layer 2 and the transfer medium (for example, the first circuit member to be mentioned below) is not degraded. As a result, the bonding performance between circuit members thereby improves.

The linear expansion coefficient CF of the fiber 2F is not specifically defined so far as it is smaller than the liner expansion coefficient CR. Above all, from the viewpoint of interconnection reliability, the linear expansion coefficient CF is preferably from 20 to 70 ppm/° C.

In a case where the first circuit member and the second circuit member to be bonded via the film material 10 differ in the linear expansion coefficient, it is desirable that the volume fraction of the fiber 2F has a unidirectional gradation in the thickness direction of the film layer 2. For example, where the thickness of the film layer 2 is referred to as TF, it is desirable that the volume fraction $VF1_{0.5}$ of the fiber 2F in the region from the surface of the film layer 2 on the side of the substrate 1 to 0.5 TF is different from the volume fraction $VF2_{0.5}$ of the fiber 2F in the region from the other surface of the film layer 2 to 0.5 TF. Hereinafter the region from the surface of the film layer 2 on the side of the substrate 1 to a predetermined position is referred to as a first region, and the remaining region (the other region than the first region, including the other surface of the film layer 2) is referred to as a second region.

In an electronic component, by laminating a film layer 2 on a circuit member having a smaller linear expansion coefficient in such a manner that the region containing many fibers 2F could face the member, the difference in the linear expansion coefficient between the circuit member and the film layer can be small and thermal stress can thereby reduce.

For example, in a case where the linear expansion coefficient CC1 of the first circuit member in the contact part thereof to the bonding material and the linear expansion coefficient CC2 of the second circuit member in the contact part thereof to the bonding material satisfy the relationship CC1>CC2, and where the volume fraction VF1 of the fiber in the first region>the volume fraction VF2 of the fiber in the second region (see FIGS. 1A and 1B), the first region of the film layer 2 is so arranged as to face the second circuit member having a smaller linear expansion coefficient CC2. On the other hand, in a case where the linear expansion coefficient CC1 of the first circuit member in the contact part thereof to the bonding material and the linear expansion coefficient CC2 of the second circuit member in the contact part thereof to the bonding material satisfy the relationship CC1>CC2, and where the volume fraction VF1<the volume fraction VF2 (see FIGS. 1C to 1E), the first region of the film layer 2 is so arranged as to face the first circuit member having a larger linear expansion coefficient CC1.

The volume fraction of the fiber 2F is determined as follows. A photographic picture of a cross section of the film material 10 in the direction perpendicular to the main surface thereof is taken, in which the area of the fiber 2F contained in the first region and the second region of the film layer 2 is individually measured. This is divided by the area of the first region or the second region of the film layer 2 to determine the volume fraction. The area of the fiber 2F may be calculated, for example, through binarization treatment of the taken picture followed by specifying the part occupied by the fiber 2F.

Figure 1B:
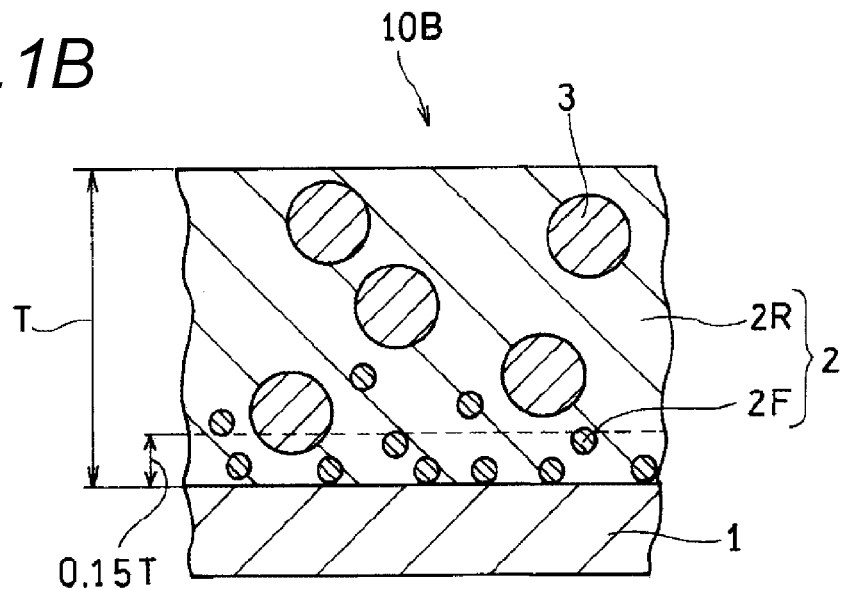
FIG. 1B is a cross-sectional view schematically showing a film material according to embodiments 1 and 2 of the present invention.

In particular, from the viewpoint of thermal stress, it is desirable that the volume fraction $VF1_{0.15}$ of the fiber 2F in the first region from the surface of the film layer 2 on the side of the substrate 1 to 0.15 TF is different from the volume fraction $VF2_{0.85}$ of the fiber 2F in the second region from the other surface of the film layer 2 to 0.85 TF (see FIGS. 1B, 1D and 1E).

From the viewpoint of separatability of the film layer 2 from the substrate 1, it is desirable that the volume fraction VF1 of the fiber 2F in the first region of the film layer 2 is larger than the volume fraction VF2 of the fiber 2F in the second region of the film layer 2. In this case, the volume fraction VF1 is preferably from 0.1 to 0.5, more preferably from 0.1 to 0.4. From the viewpoint of adhesiveness, the volume fraction VF2 is preferably from 0 to 0.1, more preferably from 0 to 0.05. In this case, in an electronic component, it is desirable that the circuit member having a smaller linear expansion coefficient is arranged to face the first region.

In a case where the linear expansion coefficient is on the same level between the first circuit member and the second circuit member to be bonded via the film material 10, the fiber 2F may be arranged uniformly inside the film layer 2 or may be arranged to have a gradient of such that the volume fraction of the fiber 2F could increase toward the center part of the film layer 2 or toward the outside thereof.

The film material 10 is thermally transferred at a relatively low temperature (for example, at 100° C. or lower) so that the thermosetting resin 2R could not cure. Therefore, from the viewpoint of adhesiveness to the transfer medium, it is desirable that the film layer 2 is flexible even at room temperature.

The flexibility at room temperature of the film layer 2 may be expressed, for example, by the tensile strength thereof. The tensile strength may be measured using a tensile tester. Concretely, the film layer 2 is layered to have a predetermined thickness (for example, 0.1 mm), and is cut out to have a predetermined size, length and width (for example, length 30 mm×width 5 mm) to prepare a sample. Both sides in the lengthwise direction of the resultant sample are chucked with a tensile tool (chucking distance 20 mm), and while heating at a predetermined speed (for example, at a speed of 100 mm/min), the chucking tool is spaced. The strength at which the sample has broken is referred to as the tensile strength of the film layer 2. The tensile strength of the film layer 2 thus measured is preferably from 10 to 200 mN, more preferably from 20 to 100 mN.

The film layer 2 may contain an electroconductive material 3. With that, the members to be bonded by the film layer 2 (for example, the first circuit member and the second circuit member to be mentioned below) are made to secure conduction therebetween. Accordingly, the film layer 2 can be used as a filmy electroconductive adhesive like ACF or the like to interconnect the electrodes facing each other (facing electrodes).

The electroconductive material 3 includes, for example, silver particles, solder particles, insulating spherical particles plated with metal, nickel particles, etc. The metal to be used for metal plating includes, for example, gold, silver, nickel-phosphorus alloy, palladium, etc. The material for the spherical particles include inorganic materials such as silica, etc., and heat-resistant resins such as polyurethane resins, epoxy resins, phenolic resins, melamine resins, polyamides, polyimides, silicone resins, fluororesins, polyesters, polyphenylene sulfides, polyphenylene ethers, etc. Above all, from the viewpoint of conductivity, solder particles are preferably used for the electroconductive material 3.

The content of the electroconductive material 3 is not specifically defined, but from the viewpoint of bonding performance and conductivity, the content is preferably from 1 to 10% by volume in the film layer 2. In a case where the electroconductive material 3 is granular, the mean particle size D50 is not specifically defined. Above all, from the viewpoint of conductivity between circuit members, the size is preferably from 1 to 10 µm, more preferably from 2 to 5 µm. The mean particle size D50 is a median diameter in the volume particle size distribution to be determined with a laser diffraction-type particle size. (The same shall apply hereinafter.)

In a case where the volume fraction of fibers differs between the first region and the second region of the film layer 2, it is desirable that the electroconductive material 3 is contained more in the region having a smaller volume fraction VF. For example, in a case where the first region is a region from the surface of the film layer 2 on the side of the substrate 1 to 0.15 TF, and where volume fraction $VF1_{0.15}$>volume fraction $VF2_{0.85}$ (see FIG. 1B), it is desirable that the volume fraction of the electroconductive material 3 in the first region, $VP1_{0.15}$, and the volume fraction of the electroconductive material 3 in the second region, $VP2_{0.85}$, satisfy $VP1_{0.15}<VP2_{0.85}$. This is because, in the above-mentioned thermal compression bonding step, the electroconductive material 3 could readily flow and the electroconductive material could readily penetrate into the space between the facing electrodes. In this case, it is more desirable that the electroconductive material 3 is not contained in the first region. In the thermal compression bonding step, the electroconductive material 3 penetrates into the voids existing between the fibers 2F in the interface between the facing electrodes, and therefore, even though the fibers 2F exist in the interface between the facing electrodes, the electroconduction could be still secured.

The thermosetting resin 2R contained in the film layer 2 is not specifically defined, and for example, the layer may contain, as the main ingredient therein, an epoxy resin, an acrylic resin, a polyimide, a phenolic resin, a silicone resin, a melamine resin, an urea resin, an alkyd resin, a polyurethane, an unsaturated polyester or the like. One alone or two or more of these resins may be used either singly or as combined. Above all, an epoxy resin is preferred from the viewpoint of handleability.

The epoxy resin includes, for example, a biphenol A-type epoxy resin, a phenol-novolak-type epoxy resin, a bisphenol F-type epoxy resin, a bisphenol AD-type epoxy resin, a naphthalene-type epoxy resin, a biphenyl-type epoxy resin, a glycidylamine-type epoxy resin, an alicyclic epoxy resin, a dicyclopentadiene-type epoxy resin, a polyether-type epoxy resin, a silicone-modified epoxy resin, etc. Above all, from the viewpoint of bonding performance, a bisphenol A-type epoxy resin is preferred. The epoxy resin may be liquid or solid at room temperature.

The thermosetting resin 2R is mixed with a curing agent, a curing accelerator, an organic solvent and the like to be a source material for the film layer 2. In a case where the thermosetting resin 2R is an epoxy resin, for example, an acid anhydride, an amine compound or the like is used as the curing agent. The curing accelerator includes an imidazole-type curing accelerator, a phosphorus-containing curing accelerator, a phosphonium salt-type curing accelerator, a bicyclic amidine, an organic metal complex, a polyamide ureide, etc. Preferably, the organic solvent has a boiling point lower than the curing temperature of the thermosetting resin to be used. Preferred examples of the organic solvent include toluene (boiling point 110° C.), hexane (boiling point 69° C.), ethyl acetate (boiling point 77° C.), methyl ethyl ketone (boiling point 80° C.), etc. One alone or two or more of these may be used either singly or as combined.

Preferably, the thickness TF of the entire film layer 2 is from 5 to 100 μm, more preferably from 10 to 30 μm. When the thickness of the film layer 2, TF, falls within the range, the flexibility improves and the thickness of the electronic component using the layer as a bonding material can be thinned. The thickness means the distance between the two main surfaces of the film layer 2.

The material of the fiber 2F (the kind of the first resin 2Fa) is not specifically defined, but from the viewpoint of heat resistance, an engineering plastic is preferably used. An engineering plastic is said to be a resin generally having a tensile strength of 500 kg/cm² or more, having a low linear expansion coefficient and excellent in strength, impact resistance, heat resistance, etc. The engineering plastic includes, for example, a polyamide (PA), a polyacetal (POM), a polycarbonate (PC), a polyether ether ketone (PEEK), a polyamideimide (PAI), a polysulfone (PSF), a polyether sulfone (PES), a polyphenylene sulfide (PPS), a polytetrafluoroethylene (PTFE), a polyarylate (PAR), a polyether imide (PEI), a polyimide (PI), etc. One alone or two or more of these may be used either singly or as combined. Above all, from the viewpoint of applicability to an electrospinning method, the first resin 2Fa is preferably PES.

The fiber diameter of the fiber 2F is preferably less than 1 μm, more preferably less than 800 nm, even more preferably less than 600 nm. Also preferably, the fiber diameter of the fiber 2F is 10 nm or more, more preferably 50 nm or more, even more preferably 200 nm or more. This is because, in thermal compression bonding where the film layer is used as a bonding material for boning circuit members, the flow of the thermosetting resin 2R is hardly disturbed. Further, when the fiber diameter of the fiber 2F falls within the range, the film layer 2 can be excellent in flexibility. In addition, when the film layer 2 contains a granular electroconductive material 3, the fiber diameter of the fiber 2F is preferably smaller than the mean particle size D50 of the electroconductive material 3. This is because the movement of the electroconductive material 3 is hardly disturbed by the fiber 2F, and therefore when the film layer is used as a bonding material, it can readily secure electroconduction.

Here, the fiber diameter is a diameter of the fiber. The diameter of the fiber is the diameter of the cross section perpendicular to the lengthwise direction of the fiber. In a case where the cross section is not circular, the greatest dimension thereof may be considered to be a diameter. The film material 10 is seen in the normal direction relative to one main surface thereof, and the width in the direction perpendicular to the lengthwise direction of the fiber 2F may be considered to be the diameter of the fiber 2F.

The mass per unit area of the film layer 2 of the fiber 2F is, from the viewpoint of interconnection reliability and heat resistance, preferably from 0.05 to 5 g/m², more preferably from 0.1 to 1 g/m².

It is desirable that the fiber 2F is, from the viewpoint of bonding performance, contained on the side of the substrate 1 of the film layer 2, for example, in the form of a nonwoven fabric of an aggregate of one or more fibers 2F randomly piled (or entangled) therein. The nonwoven fabric may be formed of two or more kinds of fibers 2F. Above all, from the viewpoint of productivity, it is desirable that one kind of the fiber 2F is contained in the nonwoven fabric. The mean thickness of the nonwoven fabric is, from the viewpoint of bonding performance, preferably from 0.05 TF to 0.2 TF relative to the thickness TF of the film layer. Concretely, the mean thickness of the nonwoven fabric is preferably from 1 to 3 μm.

The mean thickness is, for example, a mean value of the thickness of arbitrary 10 points of the nonwoven fabric. The thickness is a distance between the two main surfaces of the nonwoven fabric. Concretely, the thickness of the nonwoven fabric may be determined as follows. In the same manner as described above, a photographic picture of a cross section of the film material 10 is taken, and from an arbitrary one point on the surface opposite to the substrate 1 of the film layer 2 to the substrate 1, a line vertical to the surface is drawn, and the distance between the two fibers 2F positioned most remotely from each other among the fibers 2F overlapping with that line is measured to be the thickness of the nonwoven fabric. The other arbitrary plural points (for example, 9 points) are also analyzed in the same manner to determine the thickness of the nonwoven fabric, and the found numerical data are averaged to be the mean thickness of the nonwoven fabric. In calculating the thickness, a binarized image may also be used.

[Substrate Sheet]

The material of the substrate 1 is not specifically defined, including, for example, a resin sheet, a paper sheet, a fabric sheet, a glass fiber sheet, etc. Above all, from the viewpoint of handleability, a resin sheet is preferred. The resin to constitute the resin sheet includes polypropylene, polyethylene, polyester (polyethylene terephthalate, polybutylene terephthalate, polyethylene naphthalate, etc.), etc. Above all, polyethylene terephthalate is preferred from the viewpoint of dimensional stability, solvent resistance and cost. The thickness of the substrate 1 is not also specifically defined, but is preferably from 10 to 100 μm, more preferably from 20 to 50 μm.

The substrate 1 is, from the viewpoint of transferability, preferably coated with a release agent on the surface thereof facing the film layer 2. The release agent includes a silicone resin, a fluorine compound, etc.

[Production Method for Film Material]

The film material 10 may be produced, for example, according to the method mentioned below. Specifically, the film material 10 may be produced by arranging the fiber 2F on the substrate 1, for example, in the form of a nonwoven fabric, and then laminating a filmy thermosetting resin 2R thereon. In this case, the fiber 2F and the thermosetting resin 2R are laminated in individual layers. The film material 10 may also be produced by arranging the fiber 2F on the substrate 1, for example, in the form of a nonwoven fabric, then applying a liquid containing a thermosetting resin 2R, and thereafter removing the organic solvent from the liquid. In this case, the liquid containing a thermosetting resin 2R penetrates into the voids between the fibers 2F, and a part or all of the nonwoven fabric is buried or immersed in the liquid containing a thermosetting resin 2R. Accordingly, in thermal transferring, the fiber 2F can be prevented from separating away from the thermosetting resin 2R. By applying a sufficient amount of the thermosetting resin 2R, the volume fraction of the fiber 2F in the first region of the film layer 2 can be enlarged (see FIGS. 1A and 1B).

The film material 10 may also be produced by laminating a filmy thermosetting resin 2R on the substrate 1, or applying a liquid containing a thermosetting resin 2R onto the substrate 1, and removing the organic solvent from the liquid, and thereafter arranging the fiber 2F, for example, in the form of a nonwoven fabric. In this case, the fiber 2F and the thermosetting resin 2R can be laminated in individual layers (see FIG. 1E).

The film material 10 may also be produced by applying a liquid containing a thermosetting resin 2R onto the substrate 1, and before removing the organic solvent from the liquid, arranging the fiber 2F, for example, in the form of a nonwoven fabric. In this case, the liquid containing a thermosetting resin 2R penetrates into the voids between the fibers 2F, and a part or all of the nonwoven fabric is buried in the liquid containing a thermosetting resin 2R. In this case, by applying a sufficient amount of the liquid containing a thermosetting resin 2R, the volume fraction of the fiber 2F in the first region of the film layer 2 can be reduced (see FIGS. 1C and 1D). Above all, from the viewpoint of transferability of the film material, it is desirable that the film material is produced according to the method where the volume fraction of the fiber 2F in the first region of the film layer 2 can be enlarged.

One preferred example of the method of arranging the fiber 2F on the substrate 1 or in the layer containing a thermosetting resin 2R (thermosetting resin layer) is an electrospinning method. In the electrospinning method, first, a solution is prepared by dissolving a source material of the fiber 2F containing the first resin 2Fa in an organic solvent (source material liquid). Next, the substrate 1 is ground or charged negatively, and the source material liquid charged in a plus voltage is jetted thereto through a nozzle. In the process where the material reaches the substrate 1, the organic solvent contained in the source material liquid evaporates away, and on the substrate 1 or in the thermosetting resin layer, a fibrous material of the first resin 2Fa (fiber 2F) precipitates in the form of a nonwoven fabric.

The method of applying the liquid containing a thermosetting resin 2R is not specifically defined. For example, the method includes a microgravure method, a slot die coating method, a knife coating method, etc.

In particular, it is desirable that the step of arranging the fiber 2F on the substrate 1 and the step of film-like laminating the thermosetting resin 2R or applying the liquid containing a thermosetting resin 2R (hereinafter this may be referred to as thermosetting resin 2R application as combined) is carried out continuously. This is because the production process may be simplified.

For example, while feeding a long substrate 1 that has been wound up around a roll onto a conveyor belt, the fiber 2F is arranged on the substrate 1. The substrate 1 with the fiber 2F arranged thereon is, while conveyed as such, subsequently subjected to thermosetting resin 2R application thereto. If desired, next, the substrate 1 is introduced into a drier and dried therein to give a film material. Afterwards, the film material may be wound up around a roll.

In a case where the fiber 2F arranged on the substrate 1 has a fiber diameter of 1 μm or less, the fiber 2F would often scatter or cut. Therefore, in a case where the thermosetting resin 2R is not continuously applied after arrangement of the fiber 2F, it is desirable that, after arrangement of the fiber 2F, a protective sheet is stuck to the substrate 1 in such a manner that the fiber 2F could be sandwiched therebetween. Subsequently, a step of winding up around a roll and a cutting step may be carried out. The protective sheet is not specifically defined, and for example, a polyethylene terephthalate sheet or the like may be used.

The organic solvent for use in the source material liquid of the fiber 2F includes N-methyl-2-pyrrolidone (boiling point 202° C.), N,N-dimethylformamide (boiling point 153° C.), N,N-dimethylacetamide (DMAc, boiling point 165° C.), cyclohexanone (boiling point 156° C.), etc. One alone or plural kinds of these may be used either singly or as combined. The first resin 2Fa is dissolved in any of these solvents to prepare a source material liquid. The source material liquid may contain any other solvent. The blend ratio of the organic solvent and the first resin 2Fa in the source material liquid varies depending on the kind of the organic solvent to be selected and the kind of the first resin 2Fa. The proportion of the organic solvent in the source material liquid is, for example, from 60% by mass to 95% by mass.

The above-mentioned organic solvents all have a high boiling point. However, as described above, the organic solvent vaporizes away after the source material liquid has been jetted out and before the fiber 2F has deposited on the substrate 1, and remains little on the substrate 1. Consequently, the process of forming the film material 10 does not require any specific step of removing the solvent having dissolved the fiber 2F.

[Electronic Component]

Figure 2:
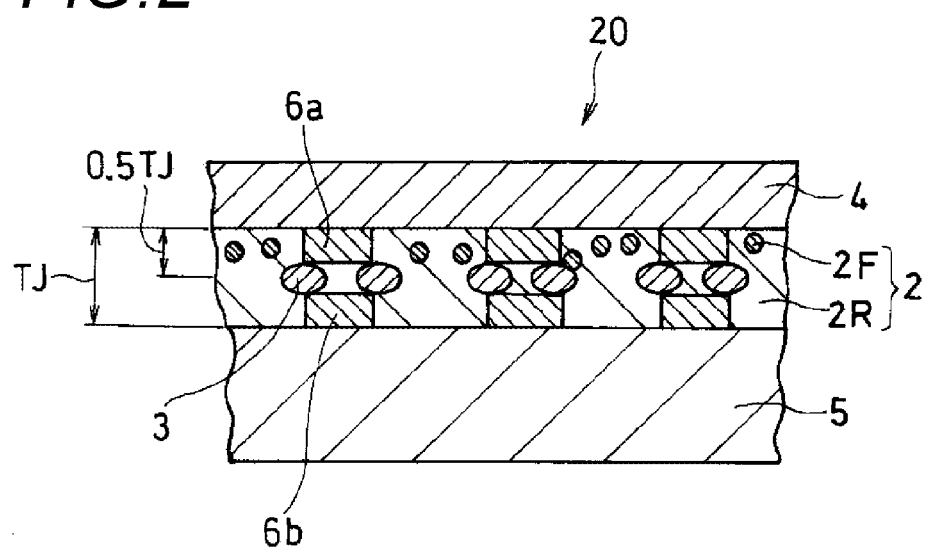
FIG. 2 is a cross-sectional view schematically showing an electronic component according to embodiments 1 and 2 of the present invention.

Next, with reference to FIG. 2, one embodiment of the electronic component of the present invention is described. FIG. 2 is a cross-sectional view schematically showing an electronic component 20 according to an embodiment of the present invention.

The electronic component 20 includes a first circuit member 5 and a second circuit member 4, in which the second circuit member 4 is mounted on the first circuit member 5 via a bonding material. The bonding material contains a fibrous first resin and a cured second resin, in which the linear expansion coefficient CF of the first resin is smaller than the linear expansion coefficient CR of the cured second resin. Consequently, the resultant electronic component 20 is excellent in interconnection reliability. The bonding material is, for example, formed of the above-mentioned film layer 2.

The cured second resin is a second resin of a thermosetting resin 2R that has been cured with a curing agent and a curing accelerator, in which the thermosetting resin 2R contains a curing agent and a curing accelerator. In other words, the cured second resin occupies the part of the bonding material from which the first resin and an electroconductive material, if any, are removed.

The first circuit member 5 and the second circuit member 4 include, for example, semiconductor elements, semiconductor chips of IC, LSI or the like, bear chips thereof, electronic component modules, passive component (chip part) semiconductor packagers, glass substrates, resin substrates, ceramic substrates and silicon substrates. The resin substrate includes, for example, an epoxy resin substrate (for example, glass epoxy substrate), a fluororesin substrate, a bismaleimidetriazine substrate, a flexible resin substrate (for example, polyimide resin substrate), etc. The first circuit member 5 and the second circuit member 4 may be the same or different.

Specifically, the electronic component 20 of the present invention may be a chip-on-board (CoB) structure such as chip-on-wafer (CoW), chip-on-film (CoF), chip-on-glass (CoG), etc., or a chip-on-chip (CoC) structure, a flexible substrate-on-board (FoB) structure, or a flexible substrate-on-flexible substrate (FoF) structure.

In a case where the linear expansion coefficient differs between the first circuit member 5 and the second circuit member 4, it is desirable to use, as the bonding material, a film material 10 in which the volume fraction of the fiber 2F has a unidirectional gradation in the thickness direction of the film layer 2 (10A to 10E, see FIGS. 1A to 1E). In this case where the thickness of the bonding material is referred to as TJ, the volume fraction $VJ1_{0.5}$ of the fibers in the region from the surface of the bonding material on the first circuit member side to 0.5 TJ is different from the volume fraction $VJ2_{0.5}$ of the fibers in the region from the surface of the bonding material on the second circuit member side to 0.5 TJ. With that, the difference in the thermal expansion coefficient between the circuit member and the surface of the film layer 2 with which the circuit member is kept in contact can reduce. As a result, interface delamination between the circuit member and the film layer 2 can be prevented.

For example, in a case where the linear expansion coefficient CC1 of the first circuit member in the contact part thereof to the bonding material and the linear expansion coefficient CC2 of the second circuit member in the contact part thereof to the bonding material satisfy CC1>CC2, it is desirable that the volume fraction $VJ1_{0.5}$ and the volume fraction $VJ2_{0.5}$ satisfy $VJ1_{0.5} < VJ2_{0.5}$. Concretely, there is exemplified a case where the first circuit member 5 is a resin substrate and the second circuit member 4 is a silicon semiconductor chip or the like.

With the above, the difference in the thermal expansion coefficient between the first circuit member 5 and the bonding material kept in contact therewith can be small and the difference in the thermal expansion coefficient between the second circuit member and the bonding material kept in contact therewith can also be small. Accordingly, thermal stress to occur in the interface between each circuit member and the film layer can be reduced and the interface delamination can be thereby prevented. In addition, deformation of electronic components also decreases. The above-mentioned volume fraction VJ applies to the region other than the region sandwiched between facing electrodes in a case where the circuit members have electrodes (6a, 6b) facing each other.

In general, after a film material has been thermally transferred onto a resin substrate having a large area, a semiconductor chip is arranged thereon. Therefore, when a film material in which the volume fraction VF1 of fibers in the first region is larger than the volume fraction VF2 of fibers in the second region (for example, the film material 10A or 10B) is used as a bonding material, the transferability also improves.

In a case where the first circuit member 5 and the second circuit member 4 individually have facing electrodes (6a, 6b), it is desirable that the bonding material contains an electroconductive material. This is because the bonding material enables interconnection between the facing electrodes. The material of the electrode includes, for example, aluminium, aluminium alloy, copper, silver, gold (plating), nickel, carbon, compounds thereof, etc. The electroconductive material to be contained in the electronic component 20 may be the above-mentioned electroconductive material 3 or may also be one formed by once melting the above-mentioned electroconductive material 3 and then solidifying it.

[Production Method for Electronic Component]

Figure 3:
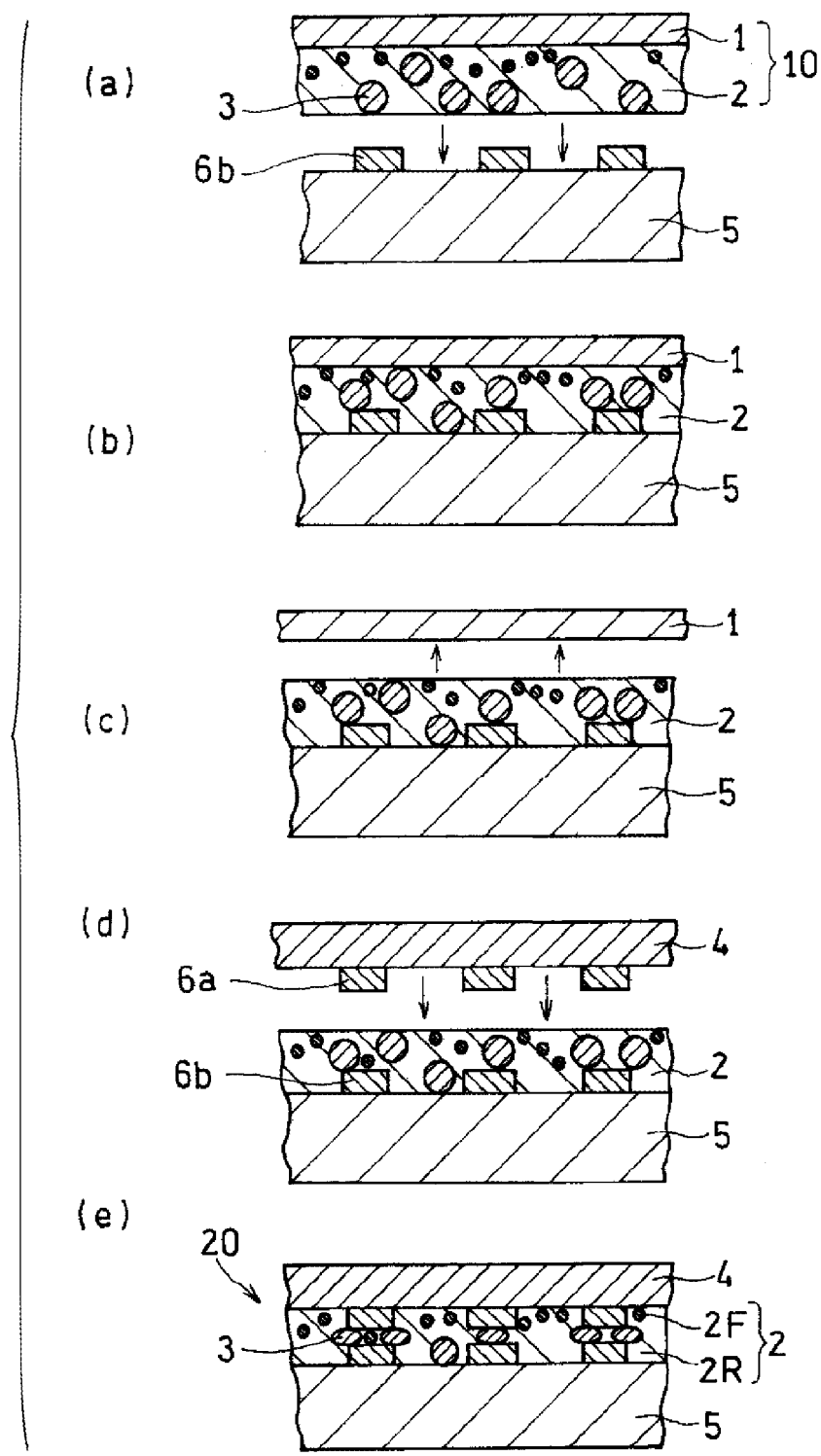
FIG. 3 shows cross-sectional views for explaining a production method for an electronic component according to embodiments 1 and 2 of the present invention ((a) to (e)).
Figure 4:
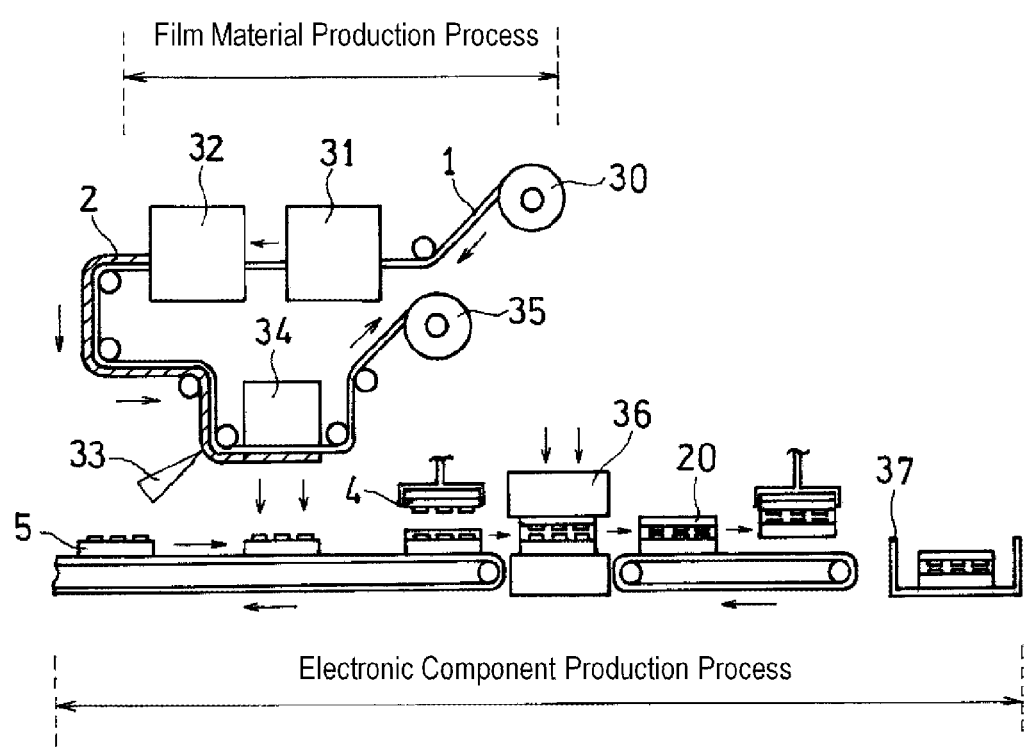
FIG. 4 is an explanatory view showing a process from production of a film material to a production of an electronic component according to embodiments 1 and 2 of the present invention.

One embodiment of the production method for an electronic component of the present invention is described concretely with reference to FIG. 3 and FIG. 4. In FIG. 3, (a) to (e) include cross-sectional views for explaining one embodiment of the production method for an electronic component of the present invention. In FIG. 3, a case is shown where a film material 10A or 10B is used as the film material. FIG. 4 is an explanatory view showing a series of steps from unwinding of the substrate 1 that is a long and thin substance to collection of the electronic component 20.

(1) Film Material Preparation Step

A film including a substrate and a film layer arranged on one main surface of the substrate is prepared. As the film material, for example, the above-mentioned film material 10 may be used.

It is desirable that the film material 10 is produced according to the method of depositing fibers 2F on the substrate 1 and continuously applying a thermosetting resin 2R onto the surface of the substrate 1 on which the fibers 2F have been deposited, among the above-mentioned methods. This is because the production step for the film material 10 can be simplified and the productivity thereby improves. The thus-produced film material 10 is, if desired, cut into a desired shape having a desired size, and then laminated on a first circuit member 5.

By producing the film material 10 according to the method, the process from winding out the substrate 1 to collection of the electronic component 20 to be produced according to the method to be mentioned below can be carried out continuously in series (as a so-called roll-to-roll process), as shown in FIG. 4. FIG. 4 shows a process where the film material 10A or 10B is produced, and using it, the electronic component 20 is produced.

For example, first, a long and thin substrate 1 wound around a supply reel 30 is unwounded onto a conveyor belt, and then conveyed to a fiber-depositing device 31. In the fiber-depositing device 31, fibers 2F are deposited on the substrate 1. Subsequently, the substrate 1 is conveyed to a resin-applying device 32, in which a thermosetting resin 2R is applied to the substrate 1 to form a film material 10A (or 10B). Subsequently, the film 10A (or 10B) is inverted and conveyed to a transfer device 34.

In the course where the film material 10A (or 10B) has been formed and conveyed to the transfer device 34, a cutting device 33 is arranged. The cutting device 33 slits the film layer 2 on the substrate 1 so that the film layer 2 could be a predetermined form having a predetermined size. In the course where the film material 10 has been formed and sent to the cutting device 33, or in the course where the film material is conveyed from the cutting device 33 to the transfer device 34, a reel for winding up the film material 10 may be arranged (not shown). With that, the difference in the conveyance speed between the production step for the film material 10 and the production step for the electronic component 20 can be cancelled.

To the transfer device 34, a first circuit member 5 is separately supplied. The transfer device 34 is equipped with a lifting mechanism (not shown) moving up and down above the first circuit member 5. When the first circuit member 5 is arranged at a predetermined position of the transfer device 34 and when the slit film material 10A (or 10B) is arranged to face the first circuit member 5, the transfer device 34 moves down. The transfer member 34 is equipped with a heating mechanism (not shown), and the film layer 2 is thermally transferred onto the first circuit member 5.

After the film layer 2 has been thermally transferred to the first circuit member 5, the substrate 1 is wound up around the recovery reel 35 and is thus recovered. On the other hand, on the first circuit member 5 on which the film layer 2 has been laminated, a second circuit member 4 is laminated, and then transferred to the thermal compression bonding device 36. In the thermal compression bonding device 36, the first circuit member 5 and the second circuit member 4 are thermally bonded under compression to complete the electronic component 20. Finally, the electronic component 20 is collected in the tray 37, and thus a series of steps finish. According to the process, the productivity of the electronic component 20 further improves.

In a case of producing film materials 10C to 10E, for example, the positions of the fiber-depositing device 31 and the resin-applying device 32 are reversed.

(2) First Circuit Member Lamination Step

The film material 10A (or 10B) is laminated on the first circuit member 5 in such a manner that the film layer 2 could face the member. In a case where the first circuit member 5 and the second circuit member 4 individually have electrodes (6a, 6b), a film material containing an electroconductive material 3 may be used.

(3) Thermal Transfer and Separating Step

Next, the film layer 2 is thermally transferred to the first circuit member 5. For carrying out the thermal transfer, the film material 10A (or 10B) is pressed against the first circuit member 5 for 1 to 3 seconds under a pressure of, for example, from 0.2 to 0.8 MPa or so at a low temperature at which the thermosetting resin 2R would not cure (FIG. 3(b)). The temperature condition is, for example, 100° C. or lower, and from 60 to 90° C. After the thermal compression bonding, the substrate 1 is separated away (FIG. 3(c)).

(4) Second Circuit Member Lamination and Thermal Compression Bonding Step

Next, the second circuit member 4 is laminated on the surface of the first circuit member 5 on which the film layer 2 has been laminated. In a case where the first circuit member 5 and the second circuit member 4 individually have electrodes in this, the second circuit member 4 is laminated in such a manner that the electrode 6a of the second circuit member 4 could face the electrode 6b of the first circuit member 5 (FIG. 3(d)).

Finally, at a temperature at which the thermosetting resin 2R in the film layer 2 could cure and under a pressure of, for example, from 1 to 4 MPa or so, the first circuit member 5 and the second circuit member 4 are thermally compressed for bonding for 20 to 60 seconds, thereby producing the electronic component 20 (FIG. 3(e)). The temperature condition is, for example, 120° C. or more, and is generally from 140 to 200° C.

The production method for the electronic component 20 is not limited to the above. For example, after the thermal transfer step and before the second circuit member lamination and thermal compression bonding step, the process may include a step of dicing the first circuit member 5 with the film layer 2 laminated thereon. In this case, the first circuit member 5 that has been individualized through the dicing is laminated on the second circuit member via the film layer 2, and bonded in the thermal compression bonding step.

The resultant electronic component 20 includes the film layer 2 containing fibers having a small linear expansion coefficient, as a bonding material. Accordingly, the thermal expansion coefficient of the bonding material can be smaller than that of the thermosetting resin 2R alone. As a result, delamination between the circuit member and the bonding material to be caused by thermal stress can be prevented and the interconnection reliability of the electronic component 20 thereby improves.

Examples of the present invention are described concretely hereinafter. However, the present invention is not limited to these Examples.

Example 1

(1) Production of Film Material

A DMAc solution containing PES (first resin 2Fa) in an amount of 20% by mass was used as a source material liquid, and according to an electrospinning method, a fiber 2F was deposited in the form of a nonwoven fabric on a substrate 1 (made of polyethylene terephthalate, thickness 38 μm) having a silicone resin coating layer. The fiber diameter of the fiber 2F was 440 nm, and the fiber 2F was deposited on the substrate 1 in an amount of 0.2 g/m$^2$. The mean thickness of the nonwoven fabric was 1.4 μm.

Subsequently, a solution for forming a film layer 2 was applied onto the surface of the substrate 1 on which the fiber 2F had been deposited. The composition of the solution is composed of 22% by mass of a bisphenol A-type epoxy resin (thermosetting resin 2R, mixture of the epoxy resin that is liquid and the epoxy resin that is solid), 22% by mass of a master batch-form imidazole-type latent curing agent, 20% by mass of toluene, 20% by mass of ethyl acetate and 16% by mass of solder particles (mean particle diameter D50: 4.5 µm, melting point 139° C.). Next, this was dried with a hot air at 70 to 80° C. to give a film material in which the thickness of the film layer 2 was 20 µm and the thickness of the nonwoven fabric formed of the fiber 2F was 1 µm.

The linear expansion coefficient CF of the fiber 2F was 56 ppm/° C., and the tensile strength of the film layer 2 was 78 mN. The volume fraction $VF1_{0.5}$ of the fiber 2F as calculated according to the above-mentioned method, was 0.09, and the volume fraction $VF2_{0.5}$ was 0. Similarly, the volume fraction $VF1_{0.15}$ was 0.62, the volume fraction $VF2_{0.85}$ was 0.02, and the volume fraction of the fiber 2F relative to the entire film layer 2, VF, was about 0.05. The volume fraction $VP1_{0.5}$ of the electroconductive material 3 was 0.018, and the volume fraction $VP2_{0.5}$ was 0.023.

(2) Production of Electronic Component

Using a glass epoxy substrate as the first circuit member 5, a silicon IC chip as the second circuit member 4 and the above-mentioned film material 10 as a bonding material, 10 electronic components 20 were produced according to the above-mentioned method. The thermal transfer step was carried out by compression at 80° C. and 0.5 MPa for 2 seconds. The compression bonding step was carried out by thermal compression at 180° C. and 1 MPa for 20 seconds. The linear expansion coefficient CR of the cured thermosetting resin 2R was 72 ppm/° C., and the glass transition point Tg thereof was 127° C. The thus-produced ten electronic components 20 were tested according to the heat resistance evaluation test mentioned below. The results are shown in Table 1.

Example 2

A film material and 10 electronic components were produced in the same manner as in Example 1, except that the deposition amount of the fiber 2F was 0.5 g/m² and the thickness of the nonwoven fabric formed of the fiber 2F was 3 µm.

The tensile strength of the film layer 2 was 96 mN. The volume fraction $VF1_{0.5}$ of the fiber 2F as calculated according to the above-mentioned method was 0.27, and the volume fraction $VF2_{0.5}$ was 0.01. Similarly, the volume fraction $VF1_{0.5}$ was 0.94, the volume fraction $VF2_{0.85}$ was 0.11, and the volume fraction VF of the fiber 2F relative to the entire film layer 2 was about 0.14. The volume fraction $VP1_{0.5}$ of the electroconductive material 3 was 0.008, and the volume fraction $VP2_{0.5}$ was 0.032. The results of the heat resistance evaluation test of those 10 electronic components 20 are shown in Table 1.

Comparative Example 1

A film material and electronic components were produced in the same manner as in Example 1, except that the step of depositing fibers on the substrate was omitted, and as the thermosetting resin 2R, 7% by mass of a liquid bisphenol A-type epoxy resin and 15% by mass of a phenoxy resin were used. The tensile strength of the film layer was 48 mN. The linear expansion coefficient CR of the cured thermosetting resin 2R was 74 ppm/° C., and the glass transition point Tg thereof was 125° C. The results of the heat resistance evaluation test of the electronic components are shown in Table 1.

[Evaluation Method]
(1) Interconnection Reliability

The samples were evaluated in a heat cycle test. In the test, the samples were kept at 40° C. for 1 hour, then heated up to 125° C. and kept as such for 1 hour. This is one cycle. The samples were subjected to 250 cycles. Before and after the test, the conduction resistance value was measured, and the resistance variation (%) was calculated. Subsequently, using an ultrasonic flaw detector, the electronic components were checked for the presence or absence of separating at the bonding material inside them. The sample in which the separating area ratio under the IC chip was 10% or more was considered as a separated NG sample, and the number of the unseparated samples in the 10 samples was counted.

TABLE 1

|  | Example 1 | Example 2 | Comparative Example 1 |
|---|---|---|---|
| Resistance Variation | 2.5 | 1.9 | 5.6 |
| Number of Unseparated Samples/10 | 3 | 0 | 9 |

Embodiment 2

An embodiment 2 of the present invention is described below. Unless otherwise specifically indicated, this embodiment is the same as the embodiment 1. The film material in the embodiment 2 of the present invention includes a substrate and a film layer arranged on one main surface of the substrate. The film layer contains a fibrous first resin and a thermosetting second resin in an uncured or semi-cured state, and the softening start temperature ST1 of the first resin is higher than the softening start temperature ST2 of the uncured or semi-cured second resin. In this case where the thickness of the film layer is referred to as T, the volume fraction $VF1_{0.5}$ of the fiber in the region from the surface of the film layer on the substrate side to 0.5 T is larger than the volume fraction $VF2_{0.5}$ of the fiber in the region from the other surface of the film layer to 0.5 T. With that, the heat resistance and the thermal transferability of the film material may improve. The film material includes, for example, ACF, NCF, die-bonding film, etc.

The diameter of the fiber contained in the film layer is preferably 1 µm or less. This is because, in a case where the film layer is used as a bonding material for bonding circuit members, the flow of the second resin is hardly disturbed during thermal compression bonding. In addition, in a case where the film layer contains an electroconductive material, the electroconductive material can readily move to secure electric conduction with ease.

Preferably, the fibers are contained in the film layer in the form of a nonwoven fabric. This is because a nonwoven fabric can make it easy to control the volume fraction of fibers in the film layer. In addition, not having directionality with respect to flexibility, the film layer of the type can readily follow any transfer medium having an uneven surface, in thermal transferring.

Preferably, the volume fraction $VF1_{0.15}$ of fibers in the region from the surface of the film layer on the substrate side to 0.15 T is larger than the volume fraction $VF2_{0.85}$ of fibers in the region from the other surface of the film layer to 0.85 T. In this case, the volume fraction $VF1_{0.15}$ is more preferably from 0.5 to 1. With that, the heat resistance and the thermal transferability of the film material may improve further.

In a case where the film layer further contains an electroconductive material, the film layer may be used as a filmy electroconductive adhesive for bonding circuit members individually having electrodes facing each other. In this case, the volume fraction of the electroconductive material in the region from the surface of the film layer on the substrate side to 0.5 T is preferably smaller than the volume fraction of the electroconductive material in the region from the other surface of the film layer to 0.5 T. This is because the electroconductive material can readily penetrate into the space between the facing electrodes.

The electronic component according to an aspect of the present invention includes a first circuit member and a second circuit member, wherein the second circuit member is mounted on the first circuit member via a bonding material, and the bonding material contains a fibrous first resin and a cured thermosetting second resin. In this, the softening start temperature ST1 of the first resin is higher than the glass transition temperature Tg of the cured second resin. With that, the heat resistance of the electronic component improves.

In the above-mentioned case where the thickness of the bonding material is referred to as TJ, the volume fraction $VJ1_{0.5}$ of fibers in the region from the surface of the bonding material on the first circuit member side to 0.5 TJ can be smaller than the volume fraction $VJ2_{0.5}$ of fibers in the region from the surface of the bonding material on the second circuit member side to 0.5 TJ.

In a case where the first circuit member and the second circuit member have electrodes facing each other, it is desirable that the bonding material contains an electroconductive material. This is because the bonding material enables electric interconnection between the facing electrodes.

The production method for the electronic component according to an aspect of the present invention includes a step of preparing a film material including a substrate and a film layer arranged on one main surface of the substrate, a step of laminating the film material on a first circuit member so that the first circuit member and the film layer could face each other, a step of separating the substrate, and a step of laminating a second circuit member on the first circuit member so that the film layer and the second circuit member could face each other, and thermally compressing the first circuit member and the second circuit member.

In this case, the film layer to be transferred onto the first circuit member contains a fibrous first resin and an uncured or semi-cured thermosetting second resin, and the softening start temperature of the first resin ST1 is higher than the softening start temperature of the uncured or semi-cured second resin ST2. When the thickness of the film layer is referred to as T, the volume fraction $VF1_{0.5}$ of the fiber in the region from the surface of the film layer on the substrate side to 0.5 T is larger than and volume fraction $VF2_{0.5}$ of the fiber in the region from the other surface of the film layer to 0.5 T. The film layer of the type is excellent in transferability and therefore the productivity improves. Further, since the heat resistance of the film layer is high, the heat resistance of the electronic component to be obtained also improves.

Preferably, the film material is produced according to a production method that includes a step of fiber-like depositing the first resin on the substrate and a step of applying the second resin onto the fiber-deposited surface of the substrate. This is because the film material production process can be simplified and the productivity thereby improves.

[Film Material]

Examples of the film material according to the embodiment 2 of the present invention are described below with reference to FIGS. 1A and 1B. These examples are to mainly demonstrate cases where the film material is thermally transferred onto a circuit member and is used as ACF or NCF. FIGS. 1A and 1B are cross-sectional views each schematically showing the film material of different examples of the present invention.

The film material 10 includes a substrate 1 and a film layer 2 arranged on one main surface of the substrate 1. The film layer 2 contains a second resin that is uncured or semi-cured and is solidified at room temperature (for example, 20 to 35° C.) (thermosetting resin 2R) and a fibrous first resin (fiber 2F). The semi-cured state means that the resin has not completely cured but has lost flowability. The solidified state means that the resin has lost flowability, and for example, as described below, in a case where a liquid containing the thermosetting resin 2R is applied onto the substrate 1, a part or all of the solvent contained in the solution has been removed in the solidified state.

The fiber 2F has a higher softening start temperature ST1 (softening point ST1) higher than the softening start temperature of the thermosetting resin 2R contained in the film layer 2. The softening start temperature of the thermosetting resin 2R contained in the film layer 2 is the softening start temperature of the thermosetting resin 2R that is uncured or semi-cured and is in a solidified state at room temperature (hereinafter this is simply referred to as "softening point ST2 of the thermosetting resin 2R"). The softening point is an index of indicating the heat resistance of the material, and a material having a high softening point can be said to be excellent in heat resistance.

The softening point ST is a temperature at which the resin starts to soften, and can be measured with a thermosmechanical analyzer (TMA). Concretely, the film layer 2 is layered to have a predetermined thickness (for example, 0.5 mm), and is cut out to have a predetermined size, length and width (for example, length 30 mm×width 5 mm) to prepare a sample. Both sides in the lengthwise direction of the resultant sample are chucked with a tensile tool, and while heating at a predetermined temperature, a minor tensile load is applied to the sample. The temperature at which the elongation of the sample has suddenly increased is referred to as the softening start temperature (softening point ST) of the resin to form the film layer 2. (The same shall apply hereinafter.)

The softening point ST2 of the thermosetting resin 2R is not specifically defined, but is, from the viewpoint of transferability, preferably from 40 to 100° C. The softening point ST1 of the fiber 2F is not also specifically defined so far as it is higher than ST2. Above all, from the viewpoint of heat resistance, the softening point ST1 is preferably from 150 to 250° C. In a case where the softening point ST1 of the fiber 2F is difficult to measure (or the fiber does not have a softening point), the fiber F2 is considered to have a softening point ST1 sufficiently higher than the softening point ST2.

The film material 10 may be used as a bonding material for circuit members that are required to have heat resistance (for example, ACF, NCF, die-bonding film, etc.). In this case, the film layer 2 is thermally transferred onto one circuit member, and the substrate 1 is separated. Next, another circuit member is laminated and thermally compressed whereby the circuit members are bonded together. Therefore, the film material is required to have excellent transferability in addition to heat resistance.

[Film Layer]

The film layer 2 contains a first resin 2Fa having a high softening point ST in the form of fibers. In other words, a first resin 2Fa shaped into fibers is arranged on the substrate 1. Therefore, not using an organic solvent having a high boiling point for dissolving the first resin 2Fa having a high softening point, the film material 10 can be produced. Namely, the step of removing an organic solvent does not require high-temperature treatment and therefore in the process of producing the film material, the thermosetting resin hardly cures. Consequently, in the thermal transfer step, the adhesiveness between the film layer 2 and the transfer medium (for example, the first circuit member to be mentioned below) is not degraded. As a result, the bonding performance between circuit members thereby improves.

The volume fraction of the fiber 2F has a unidirectional gradation in the thickness direction of the film layer 2. In other words, where the thickness of the film layer 2 is referred to as T, the volume fraction $VF1_{0.5}$ of the fiber 2F in the region from the surface of the film layer 2 on the side of the substrate 1 to 0.5 T is larger than the volume fraction $VF2_{0.5}$ of the fiber 2F in the region from the other surface of the film layer 2 to 0.5 T (see FIG. 1A). With that, the film material 10 is excellent in transferability. Specifically, in the thermal transfer step, the hardly-softening fiber 2F is arranged more on the side of the substrate 1, and therefore, the film layer 2 can be readily separated from the substrate 1. On the other hand, the easily-softening thermosetting resin 2R faces more the transfer medium, and therefore the adhesiveness of the layer to the transfer medium improves more.

The volume fraction of the fiber 2F is determined as follows. A photographic picture of a cross section of the film material 10 in the direction perpendicular to the main surface thereof is taken, in which the area of the fiber 2F contained in the region from the surface on the side of the substrate 1 to the film layer 2 to a predetermined position is measured. This is divided by the area of the region from the surface of the film layer 2 on the side of the substrate 1 to the predetermined position to determine the volume fraction. The area of the fiber 2F may be calculated, for example, through binarization treatment of the taken picture followed by specifying the part occupied by the fiber 2F.

In particular, from the viewpoint of transferability, it is desirable that the volume fraction $VF1_{0.15}$ of the fiber 2F in the region from the surface of the film layer 2 on the side of the substrate 1 to 0.15 T is larger than the volume fraction $VF2_{0.85}$ of the fiber 2F in the region from the other surface of the film layer 2 to 0.85 T (volume fraction $VF1_{0.15}$ volume fraction $VF2_{0.85}$) (see FIG. 1B).

The volume fraction $VF1_{0.15}$ is preferably from 0.5 to 1, more preferably from 0.6 to 1. With that, the fiber 2F can occupy much of the region from the surface of the film layer 2 on the side of the substrate 1 to 0.15 T, and the separatability of the film layer 2 can further improve. In addition, the volume fraction $VF2_{0.85}$ is, from the viewpoint of adhesiveness, preferably from 0 to 0.4, more preferably from 0 to 0.2.

Preferably, the volume fraction VF of the fiber 2F relative to the entire film layer 2 is from 0.01 to 0.5, more preferably from 0.04 to 0.5. When the volume fraction VF falls within the range, the film layer 2 has high heat resistance and is excellent in flexibility. With that, the adhesiveness of the layer to a transfer medium further improves. In addition, in a case where the film material is used as a bonding material for circuit members and where the volume fraction VF falls within the range, the flow of the thermosetting resin 2R in thermal compression bonding would be hardly disturbed. Consequently, the bonding performance between circuit members improves.

The film material 10 is thermally transferred at a relatively low temperature at which the thermosetting resin 2R does not cure (for example, 100° C. or lower). Consequently, from the viewpoint of adhesiveness to a transfer medium, it is desirable that the film layer 2 is flexible even at room temperature.

The flexibility at room temperature of the film layer 2 may be expressed, for example, by the tensile strength thereof. The tensile strength may be measured using a tensile tester. Concretely, the film layer 2 is layered to have a predetermined thickness (for example, 0.1 mm), and is cut out to have a predetermined size, length and width (for example, length 30 mm×width 5 mm) to prepare a sample. Both sides in the lengthwise direction of the resultant sample are chucked with a tensile tool (chucking distance 20 mm), and while heating at a predetermined speed (for example, at a speed of 100 mm/min), the chucking tool is spaced. The strength at which the sample has broken is referred to as the tensile strength of the film layer 2. The tensile strength of the film layer 2 thus measured is preferably from 10 to 200 mN, more preferably from 20 to 100 mN.

The film layer 2 may contain an electroconductive material 3. With that, the members to be bonded by the film layer 2 (for example, the first circuit member and the second circuit member to be mentioned below) are made to secure conduction therebetween. Accordingly, the film layer 2 can be used as a filmy electroconductive adhesive like ACF or the like to interconnect the electrodes facing each other (facing electrodes).

The electroconductive material 3 includes, for example, silver particles, solder particles, insulating spherical particles plated with metal, nickel particles, etc. The metal to be used for metal plating includes, for example, gold, silver, nickel-phosphorus alloy, palladium, etc. The material for the spherical particles include inorganic materials such as silica, etc., and heat-resistant resins such as polyurethane resins, epoxy resins, phenolic resins, melamine resins, polyamides, polyimides, silicone resins, fluororesins, polyesters, polyphenylene sulfides, polyphenylene ethers, etc. Above all, from the viewpoint of conductivity, solder particles are preferably used for the electroconductive material 3.

The content of the electroconductive material 3 is not specifically defined, but from the viewpoint of bonding performance and conductivity, the content is preferably from 1 to 10% by volume in the film layer 2. In a case where the electroconductive material 3 is granular, the mean particle size D50 is not specifically defined. Above all, from the viewpoint of conductivity between circuit members, the size is preferably from 1 to 10 μm, more preferably from 2 to 5 The mean particle size D50 is a median diameter in the volume particle size distribution to be determined with a laser diffraction-type particle size. (The same shall apply hereinafter.)

Preferably, the volume fraction $VP1_{0.5}$ of the electroconductive layer 3 in the region from the surface of the film layer 2 on the side of the substrate 1 to 0.5 T is smaller than the volume fraction $VP2_{0.5}$ of the electroconductive layer 3 in the region from the other surface of the film layer 2 to 0.5 T. When the electroconductive material 3 is contained more on the transfer surface side of the film layer 2, the electroconductive material 3 could be readily arranged near the region above the electrode of the circuit member of the transfer medium, in the stage of thermal transfer. Consequently, when another circuit member is laminated, the electroconductive material could readily penetrate into the space between the facing electrodes thereby further improving the electric conduction.

When the electroconductive material 3 is contained more in the region where the volume fraction VF of the fiber 2F is small, the electroconductive material 3 can be flow easily in the above-mentioned thermal compression bonding step. Consequently, the electroconductive material can readily penetrate into the space between the facing electrodes. For example, in a case where the volume fraction VF satisfies a relationship of volume fraction $VF1_{0.15}$>volume fraction $VF2_{0.85}$, it is desirable that the volume fraction $VP1_{0.15}$ of the electroconductive material 3 in the region from the surface of the film layer 2 on the side of the substrate 1 to 0.15 T is smaller than the volume fraction $VP2_{085}$ of the electroconductive material 3 in the region from the other surface of the film layer 2 to 0.85 T (volume fraction $VP1_{0.15}$<volume fraction $VP2_{0.85}$). In this case, it is more desirable that the electroconductive material 3 is not contained in the region from the surface of the film layer 2 on the side of the substrate 1 to 0.15 T. In the thermal compression bonding step, the electroconductive material 3 penetrates into the voids existing between the fibers 2F in the interface between the facing electrodes, and therefore, even though the fibers 2F exist in the interface between the facing electrodes, the electroconduction could be still secured.

The thermosetting resin 2R contained in the film layer 2 is not specifically defined, and for example, the layer may contain, as the main ingredient therein, an epoxy resin, an acrylic resin, a polyimide, a phenolic resin, a silicone resin, a melamine resin, an urea resin, an alkyd resin, a polyurethane, an unsaturated polyester or the like. One alone or two or more of these resins may be used either singly or as combined. Above all, an epoxy resin is preferred from the viewpoint of handleability.

The epoxy resin includes, for example, a biphenol A-type epoxy resin, a phenol-novolak-type epoxy resin, a bisphenol F-type epoxy resin, a bisphenol AD-type epoxy resin, a naphthalene-type epoxy resin, a biphenyl-type epoxy resin, a glycidylamine-type epoxy resin, an alicyclic epoxy resin, a dicyclopentadiene-type epoxy resin, a polyether-type epoxy resin, a silicone-modified epoxy resin, etc. Above all, from the viewpoint of bonding performance, a bisphenol A-type epoxy resin is preferred. The epoxy resin may be liquid or solid at room temperature.

The thermosetting resin 2R is mixed with a thermoplastic resin, a curing agent, a curing accelerator, an organic solvent and the like to be a source material for the film layer 2. The thermoplastic resin is mixed for the purpose of controlling the adhesiveness and the melt viscosity of the film layer 2. Preferred examples of the thermoplastic resin for use herein include a phenoxy resin, a polyurethane, a polyacetal, etc. In a case where the thermosetting resin 2R is an epoxy resin, for example, an acid anhydride, an amine compound or the like is used as the curing agent. The curing accelerator includes an imidazole-type curing accelerator, a phosphorus-containing curing accelerator, a phosphonium salt-type curing accelerator, a bicyclic amidine, an organic metal complex, a polyamide ureide, etc. Preferably, the organic solvent has a boiling point lower than the curing temperature of the thermosetting resin to be used. Preferred examples of the organic solvent include toluene (boiling point 110° C.), hexane (boiling point 69° C.), ethyl acetate (boiling point 77° C.), methyl ethyl ketone (boiling point 80° C.), etc. One alone or two or more of these may be used either singly or as combined.

Preferably, the thickness T of the entire film layer 2 is from 5 to 100 µm, more preferably from 10 to 30 µm. When the thickness of the film layer 2, T, falls within the range, the flexibility improves and the thickness of the electronic component using the layer as a bonding material can be thinned. The thickness means the distance between the two main surfaces of the film layer 2.

The material of the first resin 2Fa is not specifically defined, but from the viewpoint of heat resistance, an engineering plastic is preferably used. An engineering plastic is said to be a resin generally having a tensile strength of 500 kg/cm$^2$ or more and excellent in strength, impact resistance, heat resistance, etc. The engineering plastic includes, for example, a polyamide (PA), a polyacetal (POM), a polycarbonate (PC), a polyether ether ketone (PEEK), a polyamideimide (PAI), a polysulfone (PSF), a polyether sulfone (PES), a polyphenylene sulfide (PPS), a polytetrafluoroethylene (PTFE), a polyarylate (PAR), a polyether imide (PEI), a polyimide (PI), etc. One alone or two or more of these may be used either singly or as combined. Above all, from the viewpoint of applicability to an electrospinning method, the first resin 2Fa is preferably PES.

The fiber diameter of the fiber 2F is preferably less than 1 µm, more preferably less than 800 nm, even more preferably less than 600 nm. Also preferably, the fiber diameter of the fiber 2F is 10 nm or more, more preferably 50 nm or more, even more preferably 200 nm or more. This is because, in thermal compression bonding where the film layer is used as a bonding material for boning circuit members, the flow of the thermosetting resin 2R is hardly disturbed. Further, when the fiber diameter of the fiber 2F falls within the range, the film layer 2 can be excellent in flexibility. In addition, when the film layer 2 contains a granular electroconductive material 3, the fiber diameter of the fiber 2F is preferably smaller than the mean particle size D50 of the electroconductive material 3. This is because the movement of the electroconductive material 3 is hardly disturbed by the fiber 2F, and therefore when the film layer is used as a bonding material, it can readily secure electroconduction.

Here, the fiber diameter is a diameter of the fiber. The diameter of the fiber is the diameter of the cross section perpendicular to the lengthwise direction of the fiber. In a case where the cross section is not circular, the greatest dimension thereof may be considered to be a diameter. The film material 10 is seen in the normal direction relative to one main surface thereof, and the width in the direction perpendicular to the lengthwise direction of the fiber 2F may be considered to be the diameter of the fiber 2F.

The mass per unit area of the film layer 2 of the fiber 2F is, from the viewpoint of heat resistance, preferably from 0.05 to 5 g/m$^2$, more preferably from 0.1 to 1 g/m$^2$.

It is desirable that the fiber 2F is, from the viewpoint of bonding performance, contained on the side of the substrate 1 of the film layer 2, for example, in the form of a nonwoven fabric of an aggregate of one or more fibers 2F randomly piled (or entangled) therein. The nonwoven fabric may be formed of two or more kinds of fibers 2F. Above all, from the viewpoint of productivity, it is desirable that one kind of the fiber 2F is contained in the nonwoven fabric. The mean thickness of the nonwoven fabric is, from the viewpoint of bonding performance, preferably from 0.05 T to 0.2 T relative to the thickness T of the film layer. Concretely, the mean thickness of the nonwoven fabric is preferably from 1 to 3 µm.

The mean thickness is, for example, a mean value of the thickness of arbitrary 10 points of the nonwoven fabric. The thickness is a distance between the two main surfaces of the nonwoven fabric. Concretely, the thickness of the nonwoven fabric may be determined as follows. In the same manner as described above, a photographic picture of a cross section of the film material 10 is taken, and from an arbitrary one point on the surface opposite to the substrate 1 of the film layer 2 to the substrate 1, a line vertical to the surface is drawn, and the distance between the two fibers 2F positioned most remotely from each other among the fibers 2F overlapping with that line is measured to be the thickness of the nonwoven fabric. The other arbitrary plural points (for example, 9 points) are also analyzed in the same manner to determine the thickness of the nonwoven fabric, and the found numerical data are averaged to be the mean thickness of the nonwoven fabric. In calculating the thickness, a binarized image may also be used.

[Substrate Sheet]

The material of the substrate 1 is not specifically defined, including, for example, a resin sheet, a paper sheet, a fabric sheet, a glass fiber sheet, etc. Above all, from the viewpoint of handleability, a resin sheet is preferred. The resin to constitute the resin sheet includes polypropylene, polyethylene, polyester (polyethylene terephthalate, polybutylene terephthalate, polyethylene naphthalate, etc.), etc. Above all, polyethylene terephthalate is preferred from the viewpoint of dimensional stability, solvent resistance and cost. The thickness of the substrate 1 is not also specifically defined, but is preferably from 10 to 100 µm, more preferably from 20 to 50 µm.

The substrate 1 is, from the viewpoint of transferability, preferably coated with a release agent on the surface thereof facing the film layer 2. The release agent includes a silicone resin, a fluorine compound, etc.

[Production Method for Film Material]

The production method for the film material is the same as that in the first embodiment, and the explanation thereof is omitted here.

[Electronic Component]

Next, with reference to FIG. 2, one embodiment of the electronic component of the present invention is described. FIG. 2 is a cross-sectional view schematically showing an electronic component 20 according to an embodiment of the present invention.

The electronic component 20 includes a first circuit member 5 and a second circuit member 4, in which the second circuit member 4 is mounted on the first circuit member 5 via a bonding material. The bonding material contains a fibrous first resin and a cured thermosetting second resin. The softening start temperature of the first resin is higher than the glass transition temperature Tg of the cured second resin. In other words, since the bonding material contains fibers having a high softening point, the electronic component 20 to be obtained is excellent in heat resistance. The glass transition point Tg is measured according to a DMA method, under the measurement condition at a heating rate of 2° C./min and a frequency of 1 Hz. (The same shall apply hereinafter.)

The bonding material is, for example, the above-mentioned film layer 2. The softening point ST1 of the fiber 2F is higher than the softening point ST2 of the thermosetting resin 2R, and is, at the same time, higher than the glass transition point Tg of the cured thermosetting resin 2R. The glass transition point Tg of the thermosetting resin 2R is not specifically defined, but is, from the viewpoint of interconnection reliability, preferably from 100 to 150° C.

The cured thermosetting resin 2R is a second resin of a thermosetting resin 2R that has been cured with a curing agent and a curing accelerator, in which the thermosetting resin 2R contains a curing agent and a curing accelerator. In other words, the cured thermosetting resin 2R occupies the part of the bonding material from which the fiber 2F and an electroconductive material 3, if any, are removed.

In a case where the above-mentioned film layer 2 is used as a bonding material and where the thickness of the bonding material is referred to as TJ, the volume fraction $VJ1_{0.5}$ of the fiber 2F in the region from the surface of the bonding material on the side of the first circuit member 5 to 0.5 TJ may be smaller than the volume fraction $VJ2_{0.5}$ of the fiber 2F in the region from the surface of the bonding material on the side of the second circuit member 4 to 0.5 TJ. In a case where the circuit members individually have facing electrodes (6a, 6b), the above-mentioned volume fraction VJ is calculated in the region excepting the region sandwiched between the facing electrodes.

The first circuit member 5 and the second circuit member 4 include, for example, semiconductor elements, semiconductor chips of IC, LSI or the like, bear chips thereof, electronic component modules, passive component (chip part) semiconductor packagers, glass substrates, resin substrates, ceramic substrates and silicon substrates. The resin substrate includes, for example, an epoxy resin substrate (for example, glass epoxy substrate), a fluororesin substrate, a bismaleimidetriazine substrate, a flexible resin substrate (for example, polyimide resin substrate), etc. The first circuit member 5 and the second circuit member 4 may be the same or different.

Specifically, the electronic component 20 of the present invention may be a chip-on-board (CoB) structure such as chip-on-wafer (CoW), chip-on-film (CoF), chip-on-glass (CoG), etc., or a chip-on-chip (CoC) structure, a flexible substrate-on-board (FoB) structure, or a flexible substrate-on-flexible substrate (FoF) structure.

In a case where the first circuit member 5 and the second circuit member 4 individually have facing electrodes (6a, 6b), it is desirable that the bonding material contains an electroconductive material. This is because the bonding material enables interconnection between the facing electrodes. The material of the electrode includes, for example, aluminium, aluminium alloy, copper, silver, gold (plating), nickel, carbon, compounds thereof, etc. The electroconductive material to be contained in the electronic component 20 may be the above-mentioned electroconductive material 3 or may also be one formed by once melting the above-mentioned electroconductive material 3 and then solidifying it.

[Production Method for Electronic Component]

The production method for the electronic component is the same as that in the first embodiment, and the explanation thereof is omitted here.

The film material according one or more aspects of the present invention contains fibers having a small linear expansion coefficient, and is therefore suitable as a bonding material for bonding circuit members. The electronic component bonded using the film material according to one or more aspects of the present invention is excellent in interconnection reliability.

What is claimed is:

1. A film material comprising:
   a substrate; and
   a film layer arranged on one main surface of the substrate, wherein:
      the film layer contains a fibrous first resin and a thermosetting second resin in an uncured or semi-cured state, and
      the linear expansion coefficient CF of the first resin is smaller than the linear expansion coefficient CR of the second resin in a cured state,
      where the thickness of the film layer is referred to as T, the volume fraction $VF1_{0.5}$ of the fiber in the region from the surface of the film layer on the substrate side to 0.5 T is from 0.1 to 0.5 and the volume fraction $VF2_{0.5}$ of the fiber in the region from the surface of the film layer opposite the substrate side to 0.5 T is from 0 to 0.1.

2. The film material according to claim 1, wherein the fiber diameter of the fiber is 1 μm or less.

3. The film material according to claim 1, wherein the fiber is contained in a form of a nonwoven fabric in the film layer.

4. The film material according to claim 1, wherein:
   the volume fraction $VF1_{0.15}$ of the fiber in the region from the surface of the film layer on the substrate side to 0.15 T is different from the volume fraction $VF2_{0.85}$ of the fiber in the region from the other surface of the film layer to 0.85 T.

5. The film material according to claim 1, wherein the film layer further contains an electroconductive material.

6. The film material according to claim 1, wherein the softening start temperature ST1 of the first resin is higher than the softening start temperature ST2 of the second resin in the uncured or semi-cured state.

7. The film material according to claim 6, wherein:
   the volume fraction $VF1_{0.15}$ of the fiber in the region from the surface of the film layer on the substrate side to 0.15 T is larger than the volume fraction $VF2_{0.85}$ of the fiber in the region from the other surface of the film layer to 0.85 T.

8. An electronic component comprising:
   a first circuit member; and a second circuit member, wherein:
      the second circuit member is mounted on the first circuit member via a bonding material,
      the bonding material contains a fibrous first resin and a thermosetting second resin in a cured state, wherein the linear expansion coefficient CF of the first resin is smaller than a linear expansion coefficient CR of the second resin in the cured state; and
      where the thickness of the bonding material is referred to as TJ, the volume fraction $VJ1_{0.5}$ of the fiber in the region from the surface of the bonding material on the first circuit member surface to 0.5 TJ is from 0.1 to 0.5 and the volume fraction $VJ2_{0.5}$ of the fiber in the region from the second circuit member surface of the bonding material to 0.5 TJ is from 0 to 0.1.

9. The electronic component according to claim 8, wherein:
   the linear expansion coefficient CC1 of the first circuit member is greater than the linear expansion coefficient CC2 of the second circuit member.

10. The electronic component according to claim 8, wherein:
    the first circuit member and the second circuit member individually have electrodes facing each other, and
    the bonding material contains an electroconductive material.

11. A method for producing an electronic component, the method comprising:
    preparing a film material including a substrate and a film layer arranged on one main surface of the substrate;
    laminating the film material on a first circuit member so that the first circuit member and the film layer face each other;
    separating the substrate from the film layer; laminating a second circuit member on the first circuit member so that the film layer and the second circuit member face each other; and
    thermally compressing the first circuit member and the second circuit member, wherein:
       the film layer contains a fibrous first resin and a thermosetting second resin in an uncured or semi-cured state, and
       the linear expansion coefficient CF of the first resin is smaller than the linear expansion coefficient CR of the second resin in a cured state;
       where the thickness of the film layer is referred to as T, the volume fraction $VF1_{0.5}$ of the fiber in the region from the surface of the film layer on the first circuit member to 0.5 T is from 0.1 to 0.5 and the volume fraction $VF2_{0.5}$ of the fiber in the region from the surface of the film layer on the second circuit member to 0.5 T is from 0 to 0.1.

12. The method for producing the electronic component according to claim 11, wherein:
    the film material is produced according to a production method that comprises:
    fiber-like depositing the first resin on the substrate; and
    applying the second resin onto a surface of the substrate on which the fiber is deposited.

13. The method for producing an electronic component according to claim 11, wherein:
    the film material is produced according to a production method that comprises:
    applying the second resin to the substrate; and
    fiber-like depositing the first resin on a surface of the substrate coated with the second resin.

* * * * *